June 29, 1965 T. A. PATCHELL 3,192,405

DIODE BIAS CIRCUIT

Filed April 19, 1962

INVENTOR.
THOMAS A. PATCHELL
BY Arthur H. Swanson
ATTORNEY.

United States Patent Office 3,192,405
Patented June 29, 1965

3,192,405

DIODE BIAS CIRCUIT

Thomas A. Patchell, Havertown, Pa., assignor to Honeywell Inc., a corporation of Delaware Filed Apr. 19, 1962, Ser. No. 188,625
4 Claims. (Cl. 307—88.5)

This invention relates to signal generators. More specifically, the present invention relates to selectively variable diode biasing circuits.

An object of the present invention is to provide an improved diode biasing circuit.

Another object of the present invention is to provide an improved diode biasing circuit characterized by a temperature compensation for temperature-sensitive diodes to produce a temperature stabilized bias level.

Still another object of the present invention is to provide an improved diode biasing circuit having a current stabilized bias signal level.

A further object of the present invention is to provide an improved diode biasing circuit having a stabilized bias signal level capable of being reduced to a zero bias level.

A still further object of the present invention is to provide an improved diode biasing circuit, as set forth herein, having a simple operation and construction.

In accomplishing these and other objects, there has been provided, in accordance with the present invention, a diode biasing circuit having a transistor amplifier, arranged in a common emitter configuration, for amplifying a desired bias level applied as an input signal to the transistor amplifier. The output signal from the amplifier is taken from an emitter circuit impedance and is applied as a bias signal to a diode element used as a signal clamping device.

A better understanding of the present invention may be had from the following detailed description when read in connection with the accompanying drawing, in which.

Figure 1:
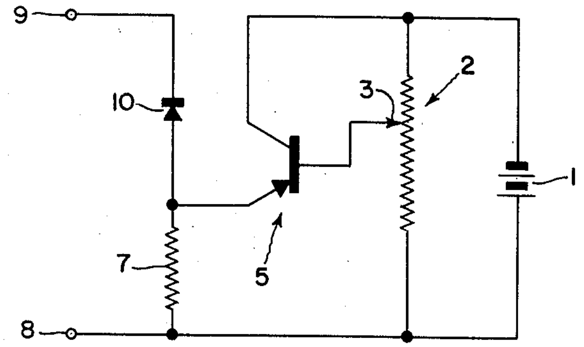
FIG. 1 is a schematic representation of selectively variable diode biasing circuit embodying the present invention.

Referring to FIG. 1 in more detail, there is shown a selectively variable diode biasing circuit having a source of unidirectional potential shown as a battery 1. A potentiometer 2 is connected across the battery 1 to provide a variable signal on a potentiometer slider 3.

The slider 3 is connected to the base electrode of a PNP transistor 5. The collector electrode of the transistor 5 is connected directly to the negative terminal of the battery 1. The emitter electrode of the transistor 5 is connected through a resistor 7 to the positive terminal of the battery 1.

The positive terminal of the battery 1 is also connected to one output terminal 8. A second output terminal 9 is connected to the cathode electrode of a diode element 10. The anode electrode of the diode 10 is connected to the emitter electrode of the transistor 5.

In operation, the present invention is effective to supply a stabilized clamping level to the output terminals 8 and 9 to clamp, or hold, an input signal applied across terminals 8 and 9 to a level determined by the setting of the potentiometer 3. The setting of the potentiometer 3 is effective to drive the transistor 5 to produce a voltage drop across the resistor 7 dependent on the current flow therethrough. This current flow comprises the emitter current for the transistor 5 and a current flow through the diode 10. The transistor 5 is effective to reduce the effect of a change in the current flow through the potentiometer 2 by the current gain of the transistor 5. In other words, the change in the voltage appearing on the slider 3 is maintained at a low level to supply a signal to the transistor 5 while the current flow through the diode 10 may be a large value. Thus, the current gain of the transistor 5 is effective to supply the current flow through the diode 10 while maintaining a stable bias voltage level on the potentiometer slider 3.

The present invention is also effective to neutralize the effect of environmental temperature changes on the diode 10. This diode may be affected by temperature variations to vary its internal impedance. The overall result of this temperature dependence is to vary the voltage drop across the diode 10. This temperature variation is neutralized by the effect of an induced temperature variation of the voltage drop across the emitter-base junction of the transistor 5. This compensation effect may be readily explained as follows:

The voltage on the slider 3 is expended as a voltage drop across the resistor 7 and the emitter-base junction. Accordingly, the voltage drop across the resistor 7 is the difference between the slider voltage and the emitter-base voltage drop. The output voltage at the terminals 8 and 9 comprises the voltage drop across the diode 10 and the resistor 7. Since the voltage drop across the resistor 7 is directly dependent on the voltage drop of the emitter-base junction, a variation of the emitter-base voltage drop may be used to compensate for any variation in the diode voltage drop. The temperature variations in the impedance of the emitter-base junction and the internal impedance of the diode are arranged to have the desired effect by a selection of the transistor 5 and the circuit components. Thus, by exposing the transistor 5 to the same environmental temperature variations affecting the diode 10, the temperature-induced variations in the itnernal impedance of the diode 10 are compensated by an equal effect of a temperature variation in the impedance of the emitter-base junction of the transistor 5 to render the clamping level at the terminals 8 and 9 independent of temperature.

Figure 2:
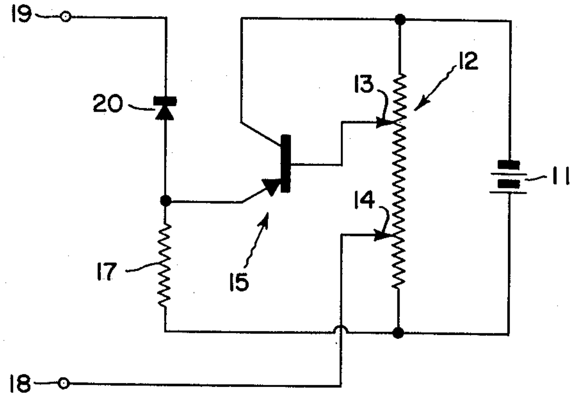
FIG. 2 is a schematic representation of another form of the diode biasing circuit shown in FIG. 1 also embodying the present invention.

Referring now to FIG. 2, there is shown a modified diode bias circuit also embodying the present invention. A unidirectional signal source 11 is arranged to supply a signal to a potentiometer 12 having a first slider 13 and a second slider 14. The first slider 13 is connected to the base electrode of PNP transistor 15. The collector electrode of the transistor 15 is connected directly to the negative terminal of the battery 11.

A first output terminal 18 is connected to the second slider 14. A second output terminal 19 is connected to the cathode electrode of a diode element 20. The anode electrode of the diode 20 is connected to the emitter electrode of the transistor 15.

The diode bias circuit shown in FIG. 2 has a similar operation to that shown in FIG. 1 with respect to the maintaining of a stable bias level and clamping action of the diode 20. However, the circuit shown in FIG. 2 has the additional feature of being able to supply a zero bias level for the diode 20. Inasmuch as it is not possible to reduce the output current of the emitter follower circuit flowing through the resistor 17 to a zero level by a variation of the first slider 13 the bias level for the diode 20 would always be above zero. In the event that a zero bias level is desired, a second slider 14 is provided on the potentiometer 12 to supply a bucking voltage to effectively make the bias level equal to zero. Thus, any remaining voltage drop across the resistor 17 is neutralized by the voltage appearing at the second slider 14 to provide an overall zero bias level.

It may be readily seen that the polarity of the clamping level may be selected by using either a PNP or an NPN transistor in the circuit shown in either FIG. 1 or FIG. 2. Such a selection would determine the connection of the battery and the diode element to the circuit to retain the diode biasing operation.

Thus, it may be seen that there has been provided, in accordance with the present invention, a diode biasing circuit characterized by the ability to maintain a stable temperature independent bias level and to produce a zero bias level.

What is claimed is:

1. A diode biasing circuit comprising a diode, a first output terminal connected to one electrode of said diode, a transistor having a base, emitter and collector electrodes, means connecting said emitter electrode to the other electrode of said diode, a second output terminal, a resistor connected between said emitter electrode and said second output terminal, a potentiometer having a first end, a second end and a slider, a pair of energizing terminals arranged to be connected to an energizing source, first circuit means directly connecting said collector electrode and said first end of said potentiometer to one of said energizing terminals and said second end of said potentiometer and the other one of said energizing terminals to said second output terminal and second circuit means connecting said base electrode to said slider of said potentiometer.

2. A diode biasing circuit as set forth in claim 1 wherein said transistor is a PNP transistor.

3. A diode biasing circuit comprising a diode, a first output terminal connected only to one electrode of said diode, a transistor having a base, emitter and collector electrodes, means connecting said emitter electrode to the other electrode of said diode, a potentiometer having a first end, a second end, a first slider and a second slider, a resistor connected between said emitter electrode and said second end of said potentiometer, a second output terminal, circuit means connecting said second slider to said second output terminal, a pair of energizing terminals arranged to be connected to an energizing source, first circuit means directly connecting said collector electrode and said first end of said potentiometer to one of said energizing terminals and said second end of said potentiometer to the other one of said energizing terminals, and second circuit means connecting said base electrode to said first slider of said potentiometer.

4. A diode biasing circuit as set fourth in claim 3 wherein said transistor is a PNP transistor.

References Cited by the Examiner

UNITED STATES PATENTS

| | | | |
|---|---|---|---|
| 2,043,161 | 6/36 | Foster | 179—1 |
| 2,751,545 | 6/56 | Chase | 307—88.5 X |
| 2,751,550 | 6/56 | Chase | 307—88.5 X |
| 2,896,151 | 7/59 | Zelinka | 307—88.5 X |
| 3,106,674 | 10/63 | Hamilton | 321—18 |
| 3,116,446 | 12/63 | Healey | 323—22 |

OTHER REFERENCES

Honeywell Application, Note ANIC, "Voltage Regulator," Dec. 6, 1961.

JOHN W. HUCKERT, *Primary Examiner.*

GEORGE N. WESTBY, *Examiner.*